(12) United States Patent
Lin et al.

(10) Patent No.: US 7,952,137 B2
(45) Date of Patent: May 31, 2011

(54) TRENCH SEMICONDUCTOR DEVICE AND METHOD OF MAKING THE SAME

(75) Inventors: Wei-Chieh Lin, Hsinchu (TW); Li-Cheng Lin, Taipei (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 96 days.

(21) Appl. No.: 12/477,121

(22) Filed: Jun. 2, 2009

(65) Prior Publication Data
US 2010/0258853 A1 Oct. 14, 2010

(30) Foreign Application Priority Data

Apr. 10, 2009 (TW) .............................. 98112026 A (51) Int. Cl.
*H01L 23/60* (2006.01)
(52) U.S. Cl. ............... 257/328; 257/330; 257/E29.257; 257/E29.242; 257/E21.419
(58) Field of Classification Search .................. None
See application file for complete search history.

(56) References Cited

U.S. PATENT DOCUMENTS

| 7,205,196 B2 | 4/2007 | Hsieh et al. |
| 2009/0008709 A1* | 1/2009 | Yedinak et al. ............... 257/331 |

* cited by examiner

*Primary Examiner* — Minh-Loan T Tran
*Assistant Examiner* — Fei Fei Yeung Lopez
(74) *Attorney, Agent, or Firm* — Winston Hsu; Scott Margo (57) ABSTRACT

A trench semiconductor device and a method of making the same are provided. The trench semiconductor device includes a trench MOS device and a trench ESD protection device. The trench ESD protection device is electrically connected between the gate electrode and source electrode of the trench MOS device so as to provide ESD protection. The fabrication of the ESD protection device is integrated into the process of the trench MOS device, and therefore no extra mask is required to define the doped regions of the trench ESD protection device. Consequently, the trench semiconductor device is advantageous for its simplified manufacturing process and low cost.

13 Claims, 14 Drawing Sheets

TRENCH SEMICONDUCTOR DEVICE AND METHOD OF MAKING THE SAME

BACKGROUND OF THE INVENTION

1. Field of the Invention

The present invention is related to a trench semiconductor device and a method of making the same, and particularly, to a trench semiconductor device having a trench metal oxide semiconductor (MOS) transistor device and a trench ESD protection device and a method of making the same.

2. Description of the Prior Art

Power MOS transistor device has high voltage and high current, and it is prone to be damaged by ESD pulse. In order to have a lower threshold voltage, the thickness of the gate oxide layer of the power MOS transistor device made by the integrated circuit process has to be reduced. Under this circumstance, power MOS is prone to be damaged by ESD pulse generated due to friction or other uncertain factors. Therefore, the present power MOS transistor device is usually constructed together with an ESD protection circuit to protect power MOS transistor device from damage. The conventional technology of forming power MOS transistor device fabricates the power MOS transistor device and then makes the ESD protection circuit which requires extra manufacturing process and cost.

U.S. Pat. No. 7,205,196 discloses a method of forming a power MOS transistor device and an ESD protection device. According to its disclosure, the formation of the ESD protection is integrated into the process of forming the power MOS transistor. However, an extra mask is required to define the pattern of the polysilicon layer which increases complexity of the process and the cost.

SUMMARY OF THE INVENTION

It is therefore a primary objective of the present invention to provide a trench semiconductor device and a method of making the same to overcome the problems of high cost and complexity of the conventional manufacturing processes.

According to the claimed invention, the present invention provides a trench semiconductor device. The trench semiconductor device includes:

a semiconductor substrate having a top surface and a bottom surface, the semiconductor substrate including a first device area and a second device area defined thereon, the top surface of the semiconductor substrate having at least a first trench disposed in the first device area and at least a second trench disposed in the second device area;

at least a trench MOS transistor device disposed in the first device area, the trench MOS transistor device including:
  a dielectric layer disposed on a sidewall of the first trench;
  a gate electrode disposed in the first trench;
  a doped body disposed in the semiconductor substrate on a side of the first trench;
  a source electrode disposed on the top surface of the semiconductor substrate and being electrically connected to the doped body; and
  a drain electrode disposed on the bottom surface of the semiconductor substrate;

a trench ESD protection device disposed in the second trench in the second device area, the trench ESD protection device including a first doped region and a second doped region, in which the first doped region has a first dopant type, the second doped region has a second dopant type, and the first doped region and second doped region have distinct dopant types; and a gate linking line disposed on the top surface of the semiconductor substrate, in which the gate linking line are electrically connected to the gate electrode of the trench MOS transistor device and the second doped region of trench ESD protection device, respectively.

According to the claimed invention, the present invention further discloses a method of making a trench semiconductor device. The method includes:

providing a semiconductor substrate, the semiconductor substrate having a first device area and a second device area defined thereon, in which a top surface of the semiconductor substrate has a first trench disposed in the first device area and at least a second trench disposed in the second device area;

forming a trench MOS transistor device in the first trench in the first device area and a trench ESD protection device in the second trench in the second device area, in which the trench MOS transistor device includes a gate electrode disposed in the first trench and a doped body disposed in the semiconductor substrate on a side of the first trench, and the trench ESD protection device includes a first doped region and a second doped region that the first doped region and the second doped region have distinct dopant types; and forming a gate linking line and a source electrode on the top surface of the semiconductor substrate, in which the gate linking line is electrically connected respectively to the second doped region of the trench ESD protection device and the gate electrode of the trench MOS transistor device, and the source electrode is electrically connected to the doped body.

According to the claimed invention, the present invention further discloses a method of making a trench semiconductor device. The method includes the following steps of:

providing a semiconductor substrate, the semiconductor substrate having a first device area and a second device area defined thereon, a top surface of the semiconductor substrate having at least a first trench disposed in the first device area and at least a second trench disposed in the second device area;

forming a dielectric layer on an inner wall of the first trench and an inner wall of the second trench;

forming a doped semiconductor layer in the first trench and the second trench, the doped semiconductor layer having a first dopant type;

forming a doped body in the first device area of the semiconductor substrate, the doped body having a second dopant type;

forming a patterned mask on a surface of the semiconductor substrate and a surface of the doped semiconductor layer, the patterned masking covering a portion of the doped semiconductor layer in the second trench;

performing an ion implantation process to modify the dopant type of doped semiconductor layer of the second trench exposed by the patterned mask, so that a first doped region is formed in the doped semiconductor layer covered by the patterned mask, and a second doped region and a third doped region are respectively formed in the doped semiconductor layer exposed by the patterned mask on each side of the first doped region, in which the second doped region and the third doped region have a second dopant type;

forming an insulating layer on a surface of the semiconductor substrate, the insulating layer exposing the second doped region and the third doped region in the second trench; and forming a gate linking line and a source electrode on the semiconductor substrate, wherein the gate linking line are electrically connected to the second doped region in the second trench and the doped semiconductor layer in the first trench, and the source electrode is electrically connected to the doped body.

According the claimed invention, the formation of the trench ESD protection device is integrated into the manufacturing process of the trench MOS transistor device, and no extra mask is required. Therefore, the method of the present invention has the advantages of simplifying the manufacturing process and reducing production costs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
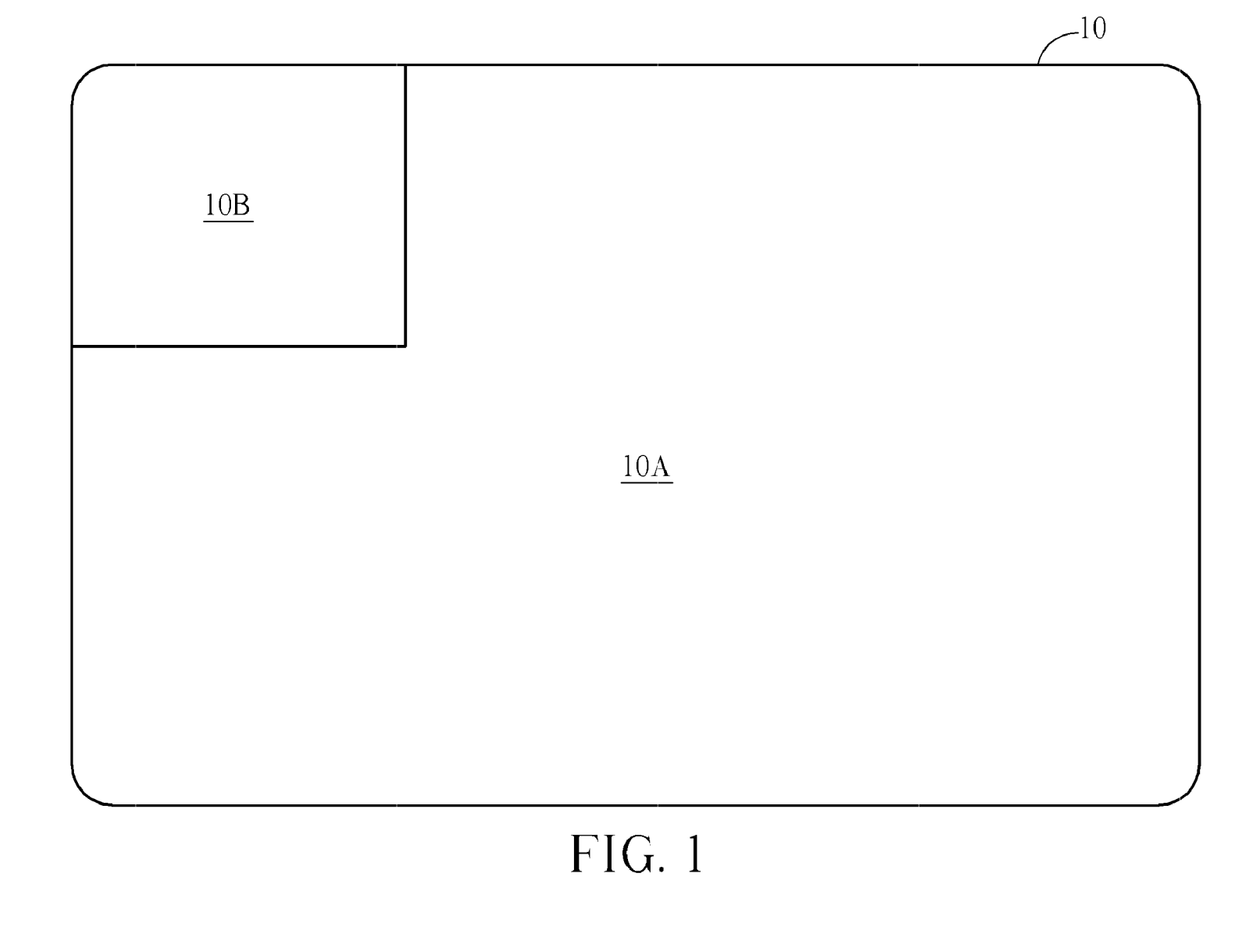
FIGS. 1-10 are schematic diagrams illustrating a method of making a trench semiconductor device according to a preferred embodiment of the present invention.
Figure 2:
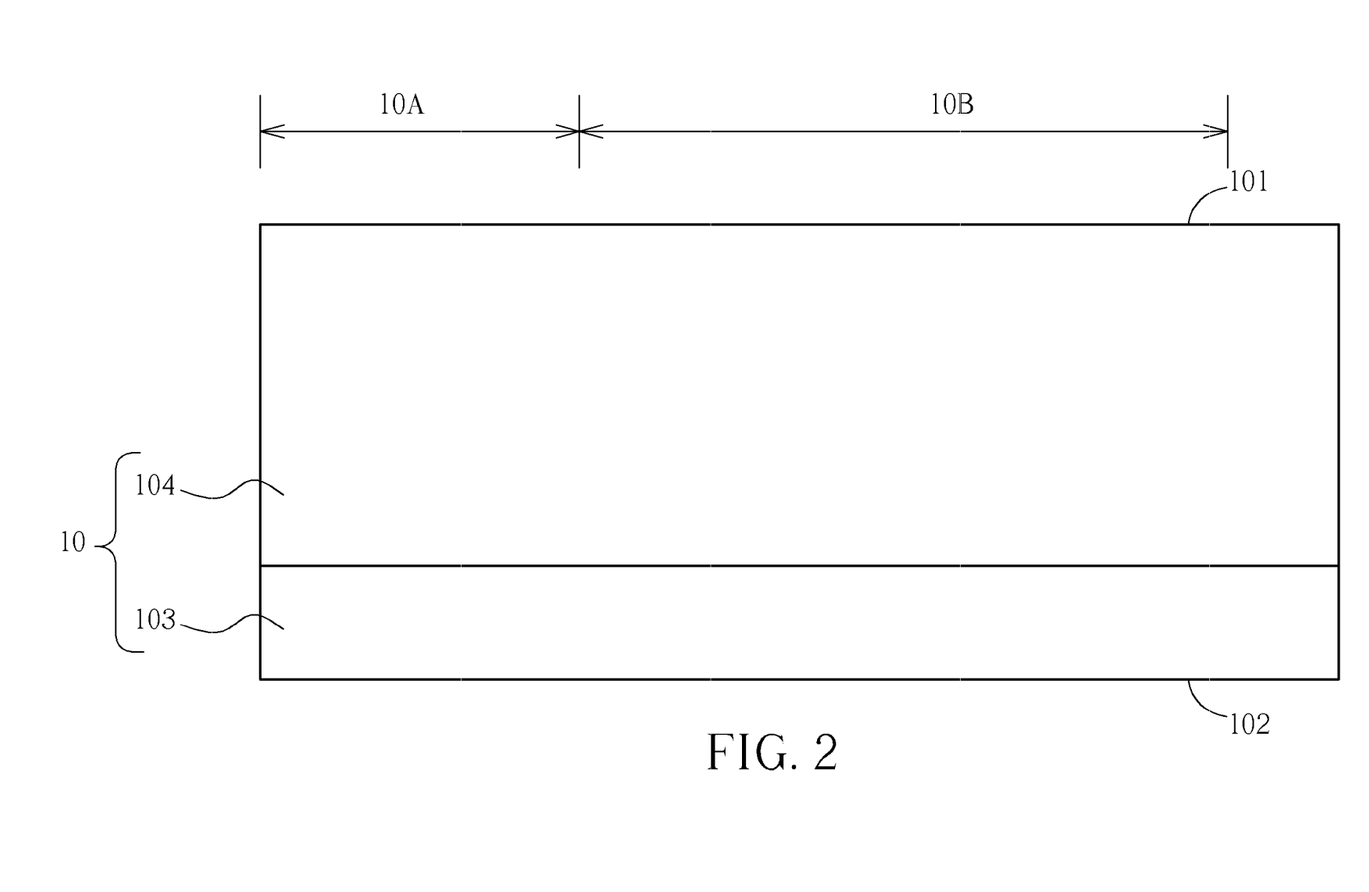

Please refer to FIGS. 1-10. FIGS. 1-10 are schematic diagrams illustrating a method of making a trench semiconductor device according to a preferred embodiment of the present invention. FIG. 1 is a top-view diagram, and FIGS. 2-10 are cross-sectional view diagrams. As shown in FIG. 1 and FIG. 2, a semiconductor substrate 10 is provided. The semiconductor substrate 10 includes a top surface 101 and a bottom surface 102. A first device area 10A and a second device area 10B are defined on semiconductor substrate 10. The first device area 10A is predetermined to form a trench MOS transistor device therein, and the second device area 10B is predetermined to form a trench ESD protection device therein. In the present embodiment, the semiconductor substrate 10 includes a silicon substrate 103 and an epitaxial silicon layer 104 disposed on the silicon substrate 103. The material of the semiconductor substrate 10 is not limited to this. The semiconductor substrate may be a single-layered structure or a multi-layered structure made of other suitable semiconductor materials.

Figure 3:
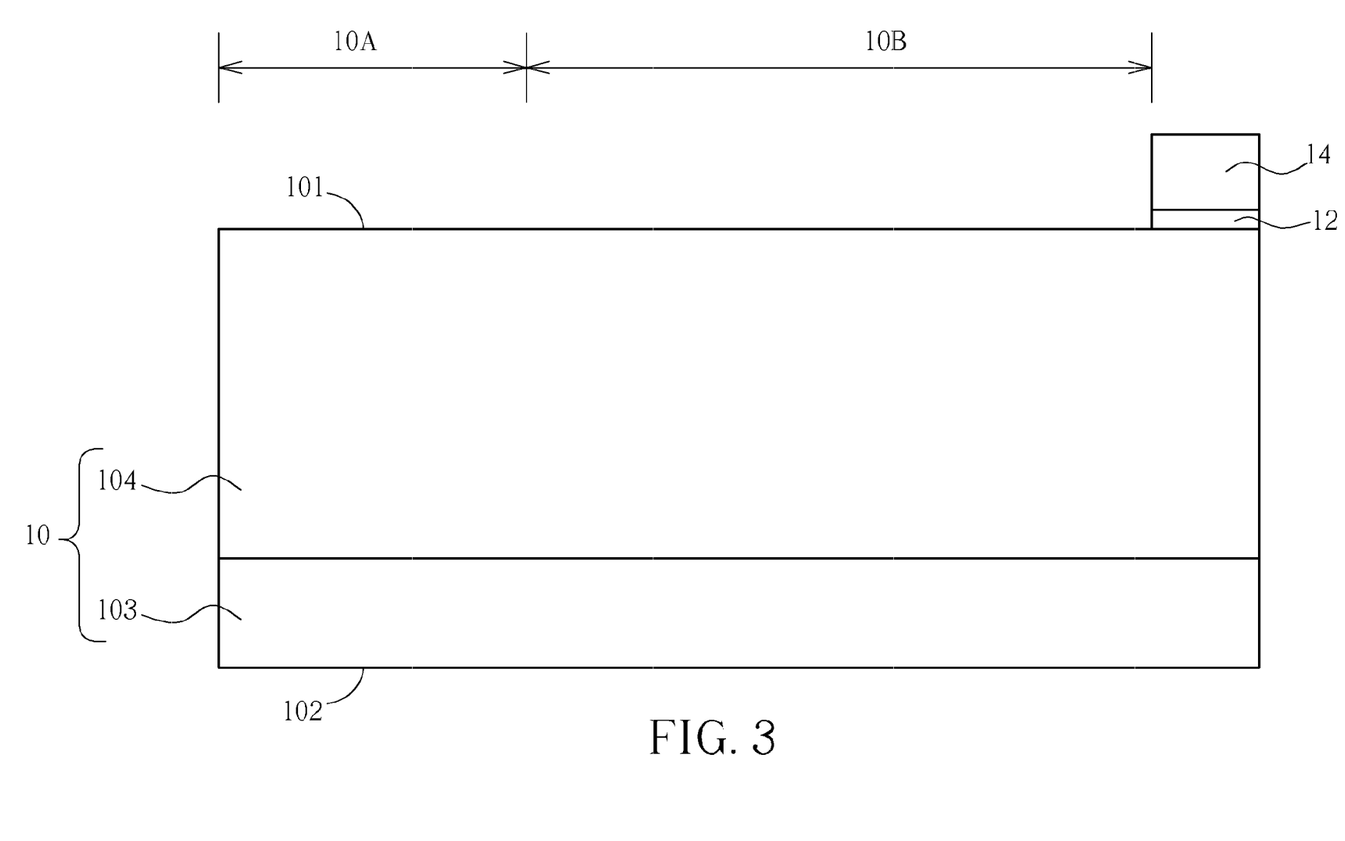

As shown in FIG. 3, a dielectric layer 12 is formed on the top surface 101 of the semiconductor substrate 10. A first mask is used in company with a lithography process to form a patterned photoresist 14 on the dielectric layer 12. An etching process is performed to define the dielectric layer 12. The dielectric layer 12 is used for isolating the semiconductor substrate 10 from the gate linking line to be formed in the following process. The dielectric layer 12 may be a silicon oxide layer formed by a deposition process or a thermal oxidation process, but not limited to this. Other dielectric materials are allowable for forming the dielectric layer 12.

Figure 4:
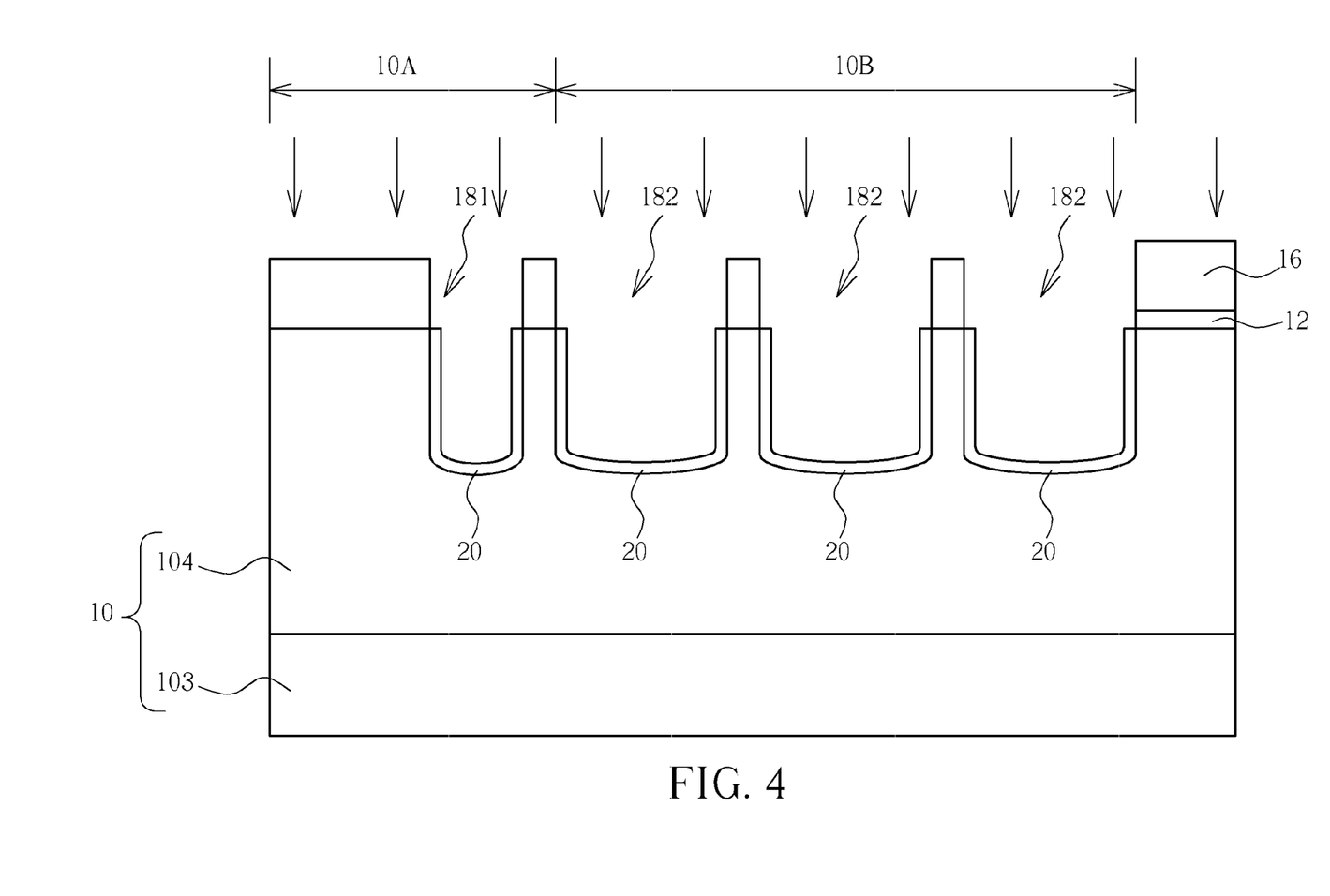

As shown in FIG. 4, the patterned photoresist 14 is removed. A second mask is used in company with a lithography process to form another patterned photoresist 16 on the top surface 101 of the conductive substrate 10. An etching process is performed, such as an anisotropic etching process to remove a portion of the semiconductor substrate 10 exposed by the patterned photoresist 16 so that at least a first trench 181 is formed on the top surface 101 of the semiconductor layer 10 in the first device area 10A and at least a second trench 182 is formed in the second device area 10B. Before the removal of the patterned photoresist 16, a dielectric layer 20, such as an oxidation layer formed by a thermal oxidation process, is formed on an inner wall of the first trench 181 and an inner wall of the second trenches 182. The dielectric layer 20 disposed on the inner wall of the first trench 181 is used as a gate insulating layer of the posteriorly formed trench MOS transistor device in the following process. The dielectric layer 20 disposed on the inner wall of the second trenches 182 is used for isolating the posteriorly formed trench ESD protection device from the semiconductor substrate 10. A plurality of second trenches 182 is formed in the second device area 10B which are used to form a plurality of predetermined trench ESD protection devices connected in series in the following process for enhancing the strength of the ESD protection. The number of the second trench is not limited and may be adjusted depending on the expected strength of the ESD protection.

Figure 5:
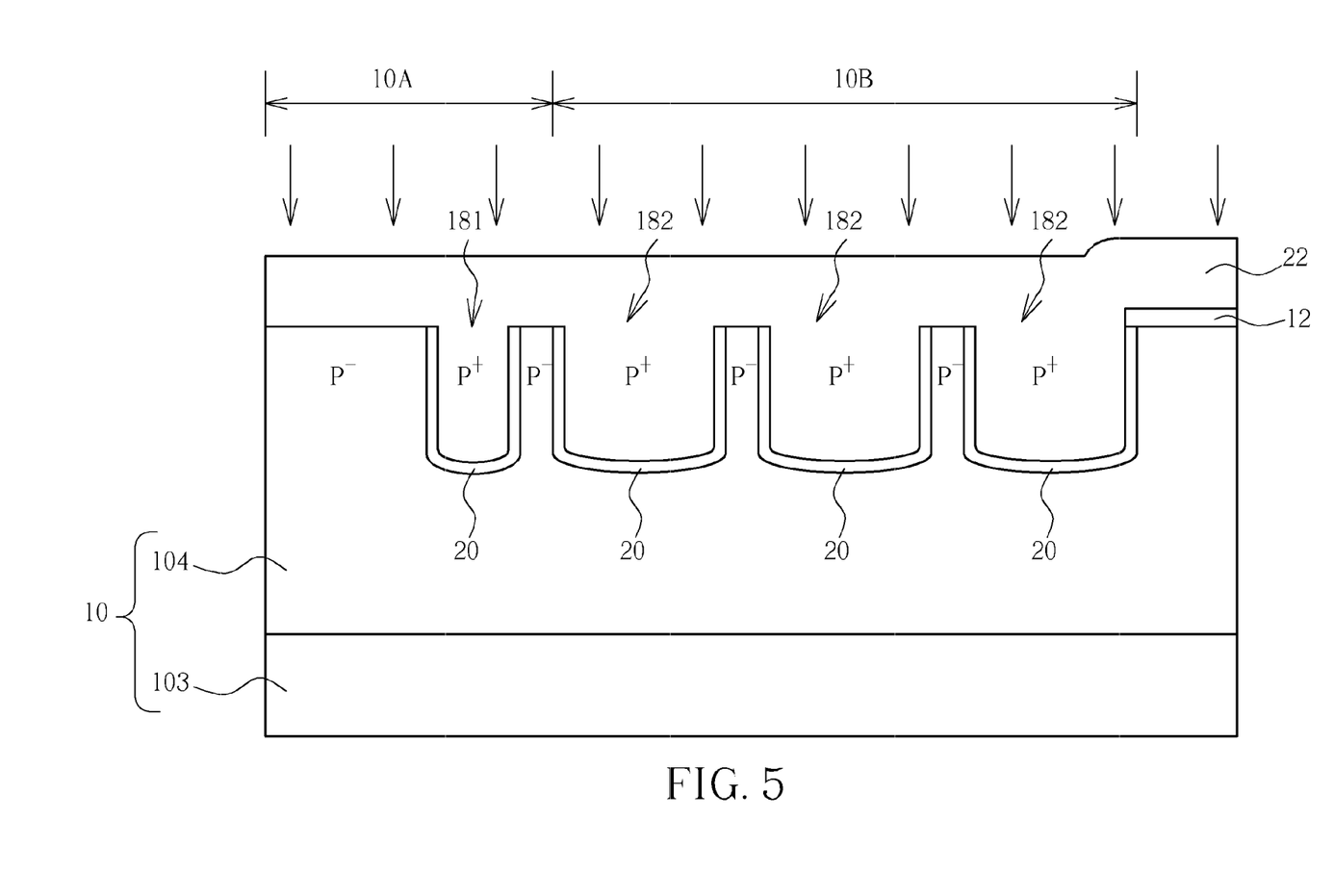

As shown in FIG. 5, the patterned photoresist 16 is removed. A semiconductor layer is formed on the top surface 101 of the semiconductor substrate 10, and the first trench 181 and the second trenches 182 are filled with the semiconductor layer. An ion implantation process is performed to transform the semiconductor layer into a doped semiconductor layer 22. A thermal process is performed to diffuse the dopants so that the doped semiconductor layer 22 in the first trench 181 is used as the gate electrode of the posteriorly formed trench MOS transistor device. The doped semiconductor layer 22 in the second trenches 182 is used as the material of the trench ESD protection device formed in the following process. In the present embodiment, the doped semiconductor layer 22 uses polysilicon as material, but not limited to it. Semiconductor materials having similar property to polysilicon are allowable. In addition, the doped semiconductor layer 22 is heavily doped and has a first dopant type.

Figure 6:
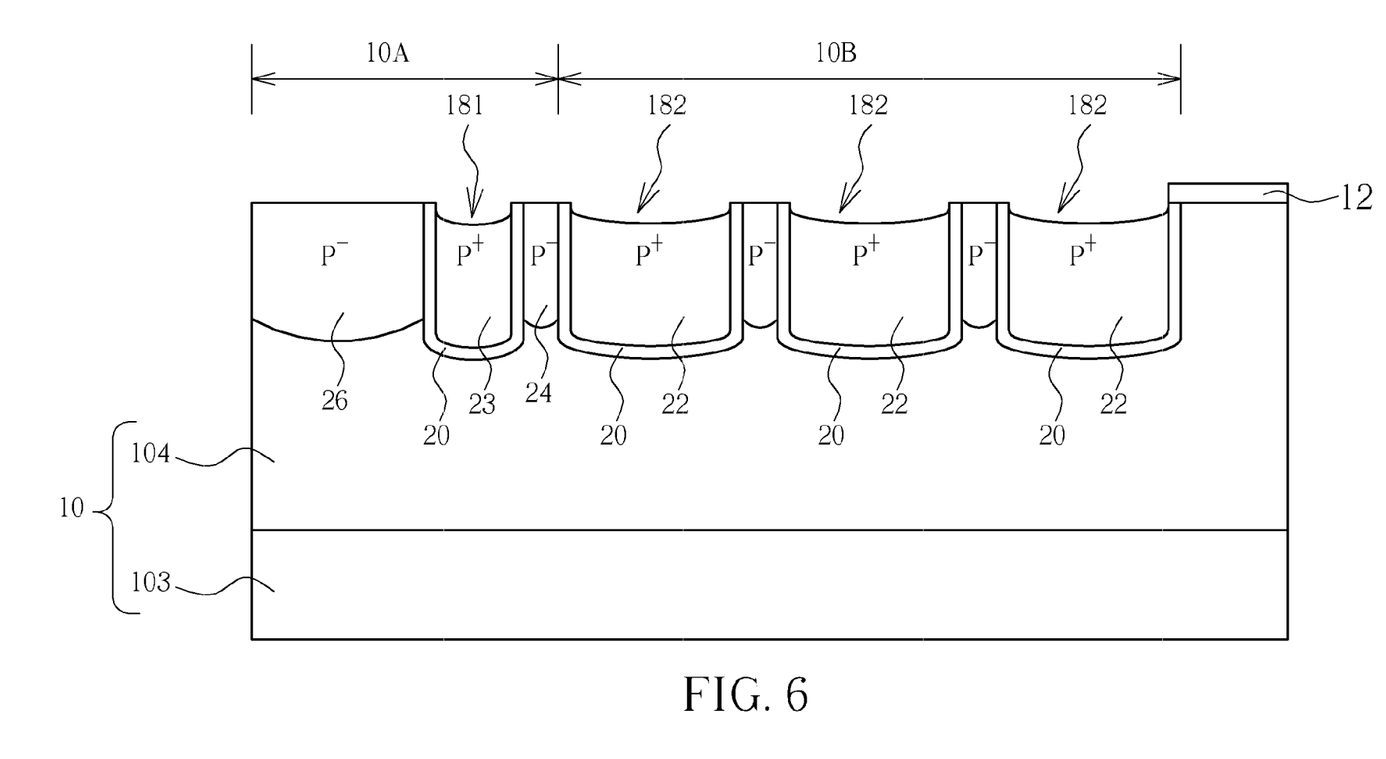

As shown in FIG. 6, an etch-back process is performed to blanketly remove the doped semiconductor layer 22 disposed on the top surface 101 of the semiconductor substrate 10. Nevertheless, the doped semiconductor layer 22 in the first trench 181 and the second trenches 182 is preserved after the etch-back process. In addition, the doped semiconductor layer 22 in the first trench 181 acts as a gate electrode 23 of the trench MOS transistor device. Another ion implantation process is performed, such as a blanket ion implantation, upon the semiconductor substrate 10 and the semiconductor layer 22. During the ion implantation process, low-dose dopants of the first dopant type are introduced so that a lightly doped region 24 is formed in semiconductor substrate 10 exposed by the dielectric layer 12. A doped body 26 is formed in the semiconductor substrate 10 on a side of the first trench 181 opposite to the second trenches 182. The gate electrode 23 in the first trench 181 and the doped semiconductor layer 22 are heavily doped which are not effected during the ion implantation process.

Figure 7:
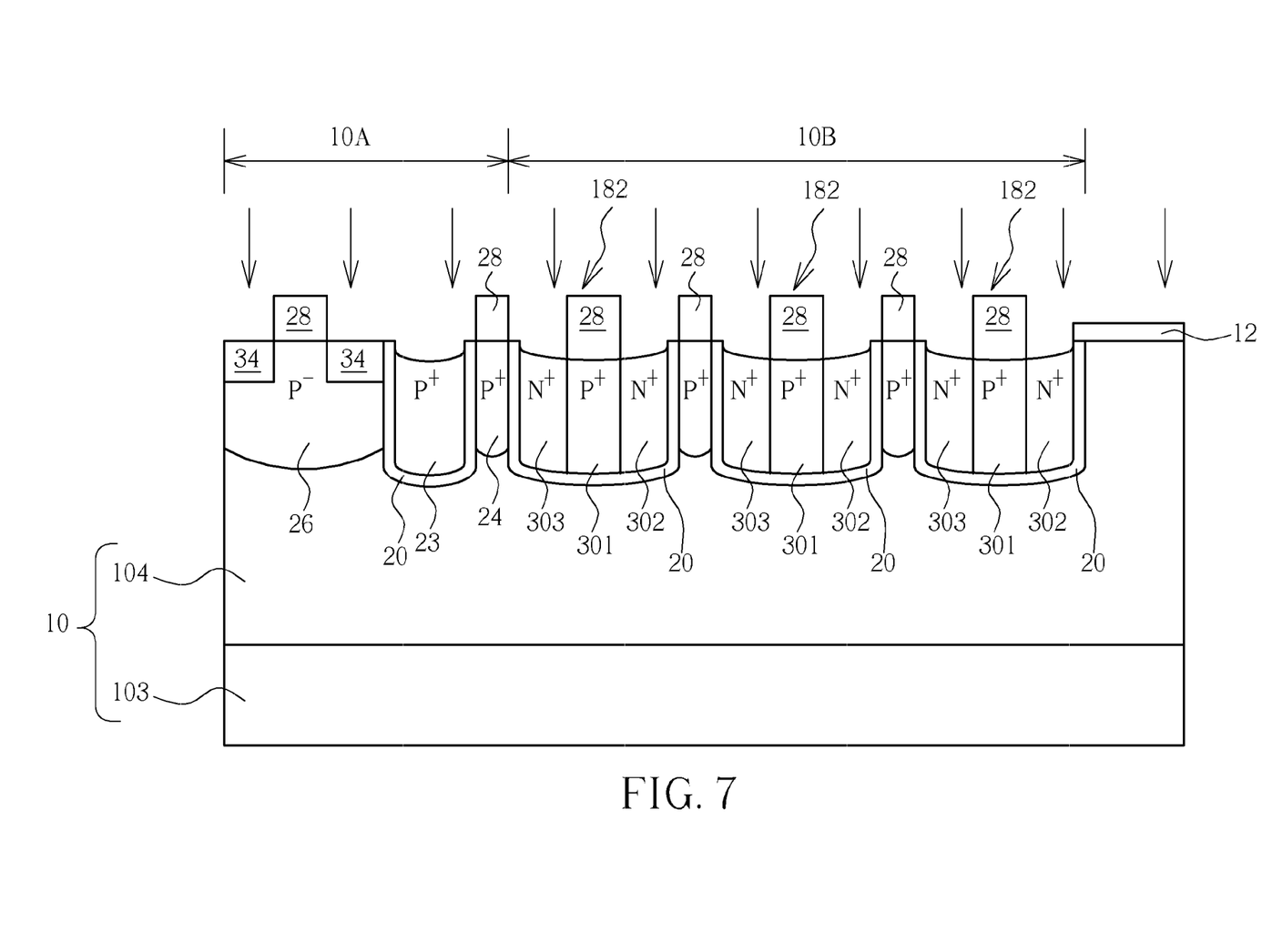

As shown in FIG. 7, a third mask is used in company with a lithography process to form a patterned photoresist 28 on the top surface 101 of the semiconductor substrate 10. The patterned photoresist 28 covers the doped region 24, a portion of the doped semiconductor layer 22 of each of the second trench 182, and a portion of the doped body 26. An ion implantation process is performed to introduce high-dose dopants of second dopant type into the doped semiconductor layer 22 and the doped body 26 exposed by the patterned photoresist 28. A second doped region 302 and a third doped region 303 are formed in each of the second trench 182. In addition, a portion of the doped semiconductor layer 22 covered by the patterned photoresist 28 is protected from the ion implantation process, and therefore, a first doped region 301 is formed between the second doped region 302 and the third doped region 303. Since the first doped region 301 and the second doped region 302 have distinct dopant types, a diode consisting of first doped region 301 and the second doped region 302 having a PN junction is formed. In addition, another diode consisting of the first doped region 301 and the third doped region 303 which has another PN junction is formed. Therefore, the first doped region 301, the second doped region 302, and the third doped region 303 may construct a bi-directional ESD protection diode, such as a bi-directional Zener diode. Moreover, two doped regions 34 are formed in the doped body 26 exposed by the patterned photoresist 28.

Figure 8:
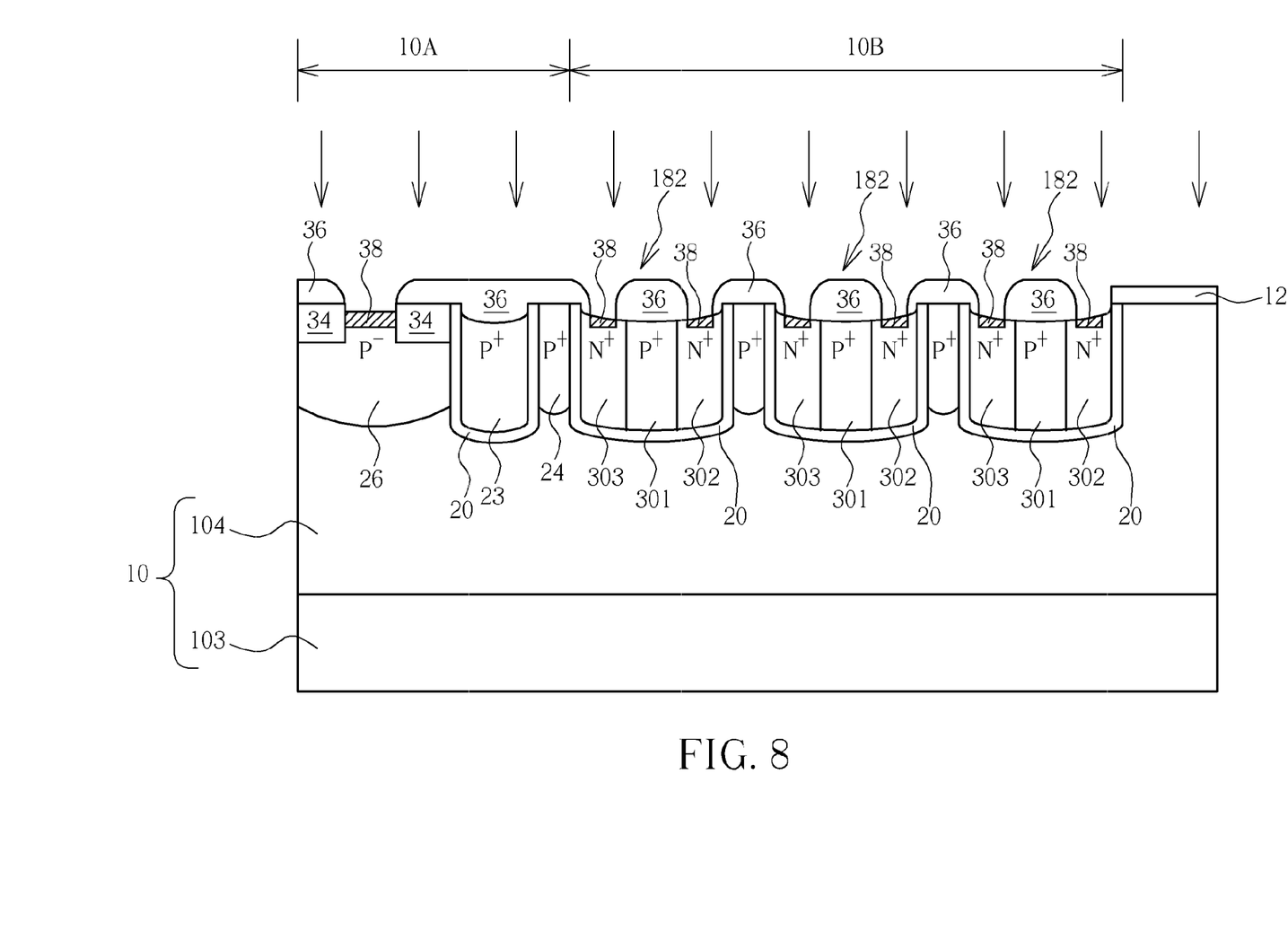

As shown in FIG. 8, the patterned photoresist 28 is removed. A fourth mask is used with a lithography process to form an insulating layer 36 on the top surface 101 of the semiconductor substrate 10. The insulating layer 36 may be a borophosposilicate glass (BPSG) layer or a dielectric layer made of other kinds of materials. The insulating layer 36 exposes the second doped regions 302 and the third doped regions 303 in the second trenches 182 and the doped body 26. An ion implantation process is performed to introduce high-dose dopants of second dopant type into the doped body 26, the second doped region 302 and the third doped region 303 exposed by the insulating layer 36 so as to form a heavily doped contact region 38 on the surface of the doped body 26, the second doped region 302, and the third doped region 303.

Figure 9:
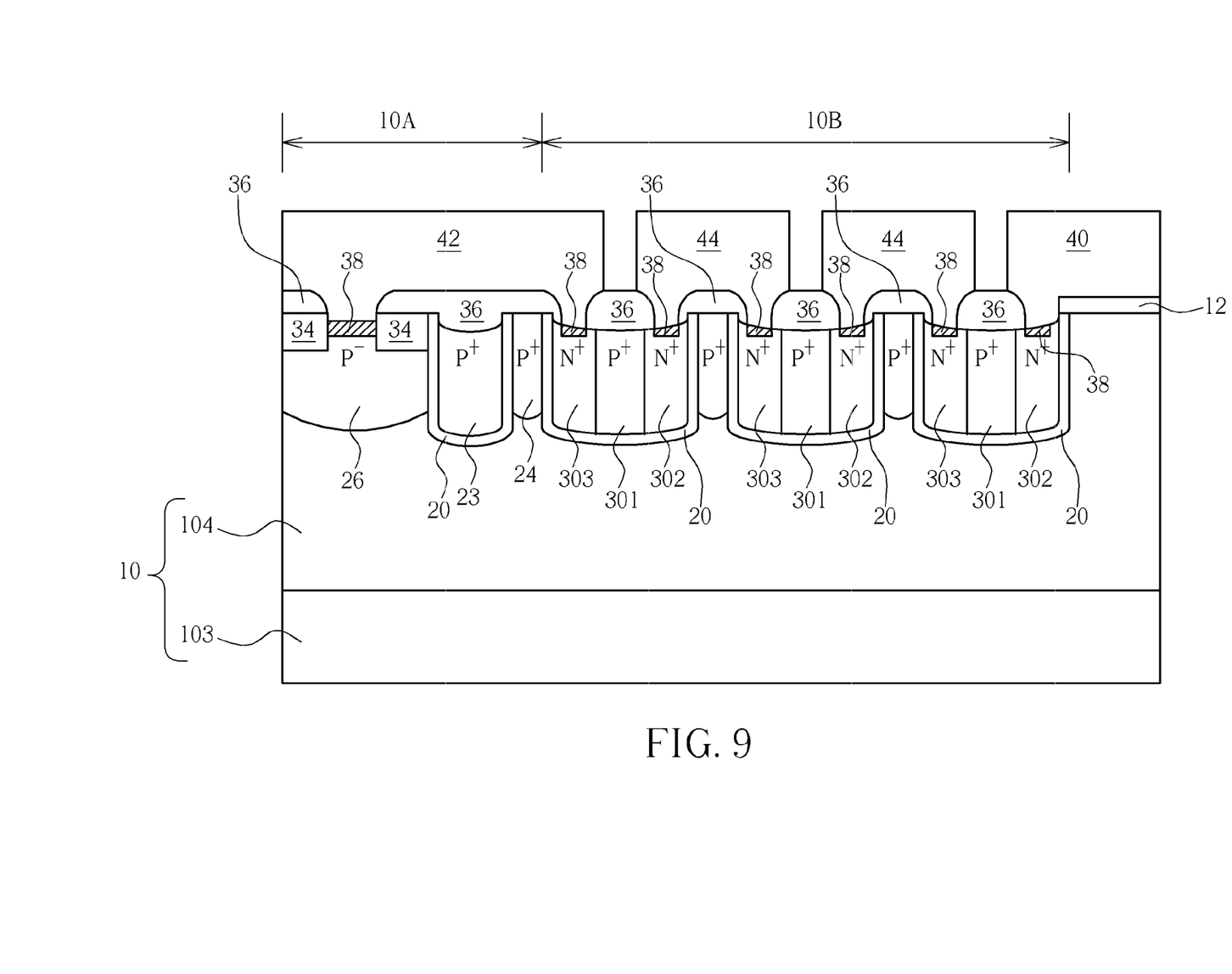

As shown in FIG. 9, a fifth mask is used with a lithography process to form a gate linking line 40, a source electrode 42, and connection electrodes 44 on the top surface 101 of the semiconductor substrate 10. Each of the gate linking lines 40 is electrically connected to contact region 38 of the second doped region 302 in the second trench 182 and the gate electrode 23 in the first trench 181. The source electrode 42 is electrically connected to the contact region 38 of the doped body 26. In addition, the contact region 38 of the third doped region 303 in one of the second trench 182 is electrically connected to the contact region 38 of the second doped region 302 in another second trench 182 by the connection electrodes 44 so that the trench ESD protection devices are electrically connected in series.

Figure 10:
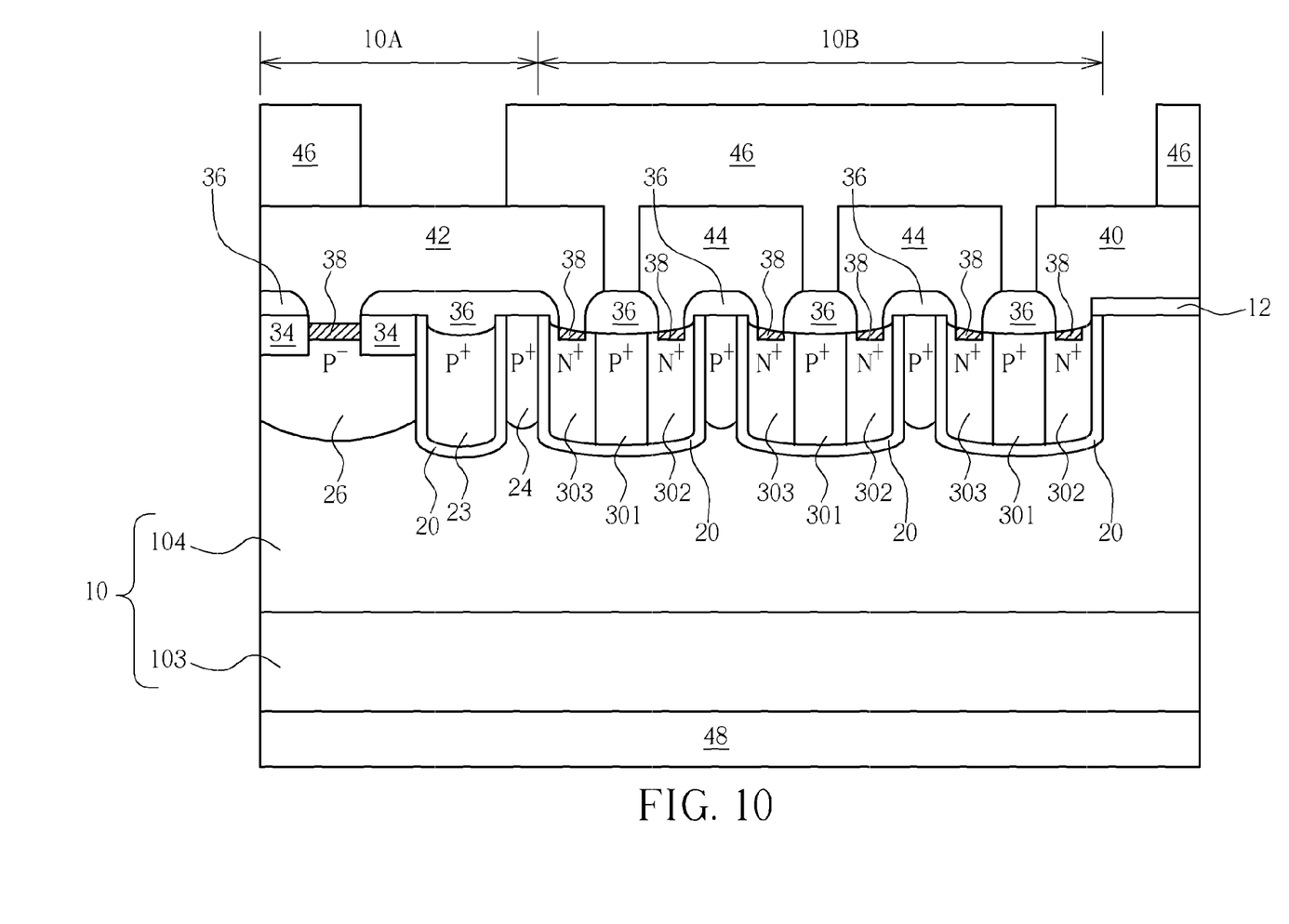

As shown in FIG. 10, a sixth mask is used with a lithography process to form a passivation layer 46 on the top surface 101 of the semiconductor substrate 10. The passivation layer 46 exposes a portion of the gate linking line 40 and the source electrode 42. The exposed gate linking line 40 and the source electrode 42 are used to form an interconnection for electrical connection in the following process. A drain electrode 48 is formed on the bottom surface 102 of the semiconductor substrate 10. It should be noted that the drain electrode 48 is formed on the bottom surface 102 of the semiconductor substrate 10, and the formation of the drain electrode 48 is not limited to be formed in this step. The formation of the drain electrode 48 may be performed in other steps; i.e. before or after the processes of forming the devices on the front surface of the semiconductor substrate 10.

Figure 11:
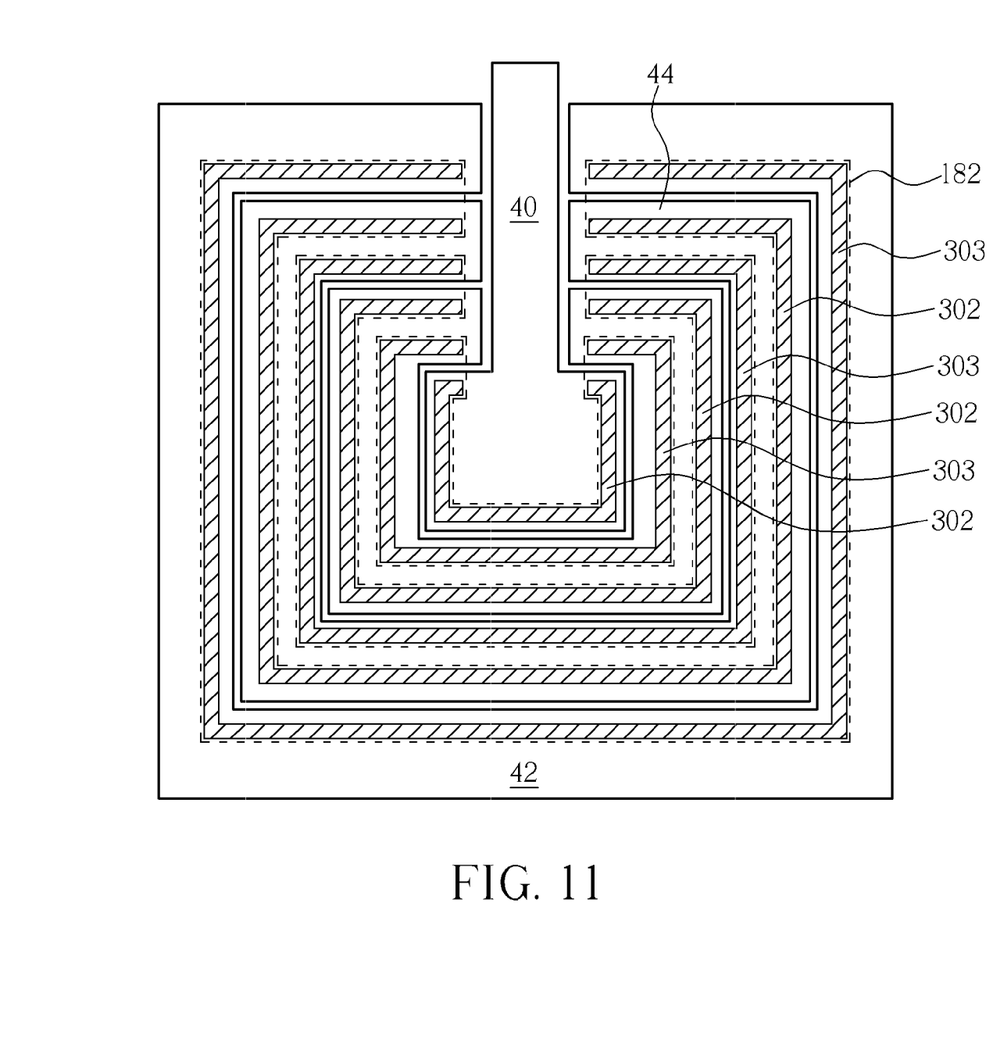
FIG. 11 and FIG. 12 are schematic diagrams illustrating the trench ESD protection device of the present embodiment.
Figure 12:
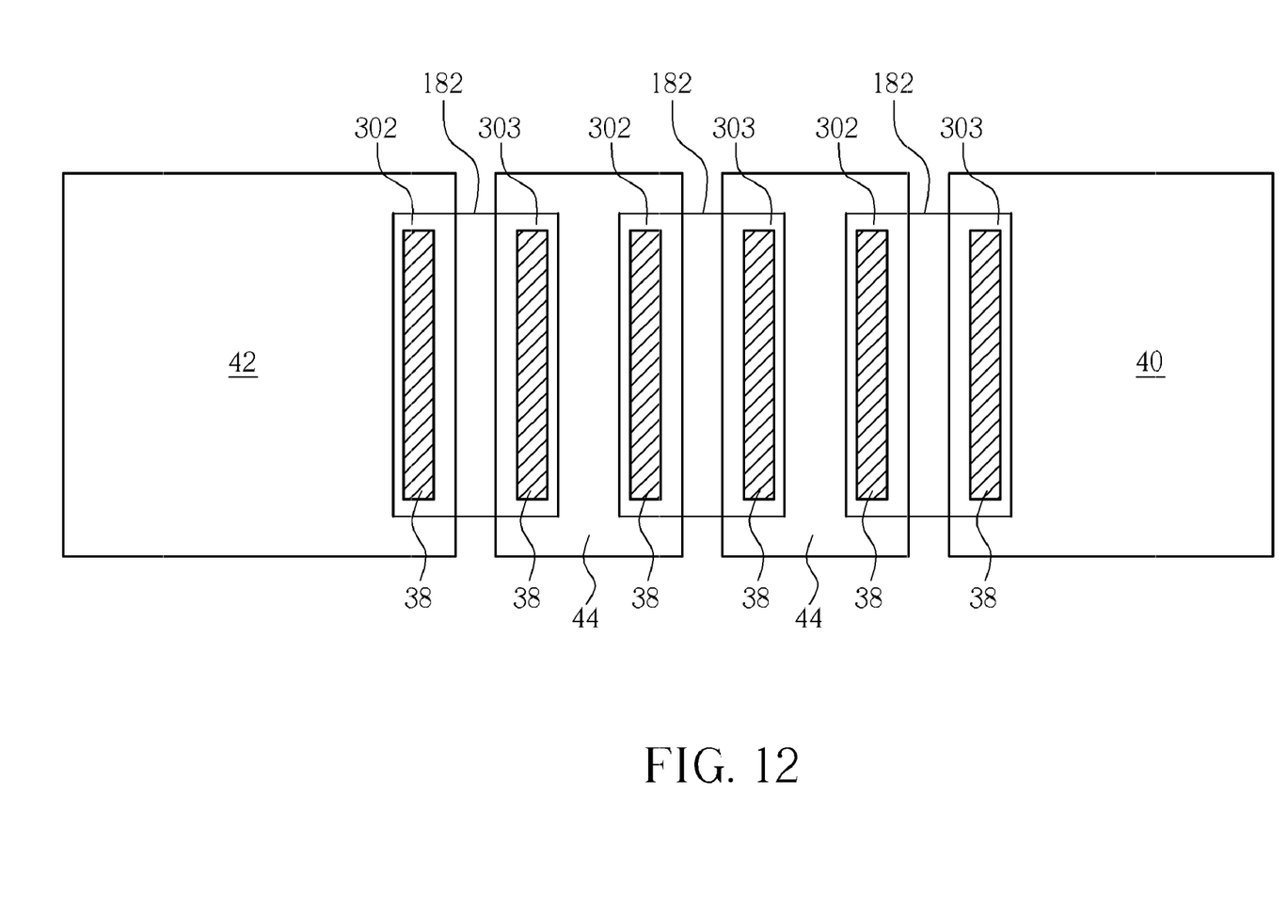

Please refer to FIG. 11 and FIG. 12. FIG. 11 and FIG. 12 are schematic diagrams illustrating the trench ESD protection device of the present embodiment. FIG. 12 is a partial enlarged diagram of FIG. 1. As shown in FIG. 11 and FIG. 12, a plurality of trench ESD protection device are respectively formed in the corresponding second trenches 182. The gate linking line 40 is electrically connected to the contact region 38 of the second doped region 302 of one of the trench ESD protection device. The connection electrodes 44 are electrically connected to the connection regions 38 of the third doped region 303 of the trench ESD protection device and the connection regions 38 of the second doped region 302 of the adjacent trench ESD protection device so that the trench ESD protection devices are electrically connected in series. In addition, the source electrode 42 is electrically connected to the connection region 38 of the third doped region 303 of the trench ESD protection device opposite to the gate linking line 40. As shown in the present embodiment, the top-view of each second trench 182 is an unclosed square-shaped ring, and the size of the second trenches is increased from the inner ring to the outer ring. The shape of the connection electrode 44 is similar to the second trench 182. Additionally, the shape of the second trench 182 is not limited; other configurations of shape are allowable.

Figure 13:
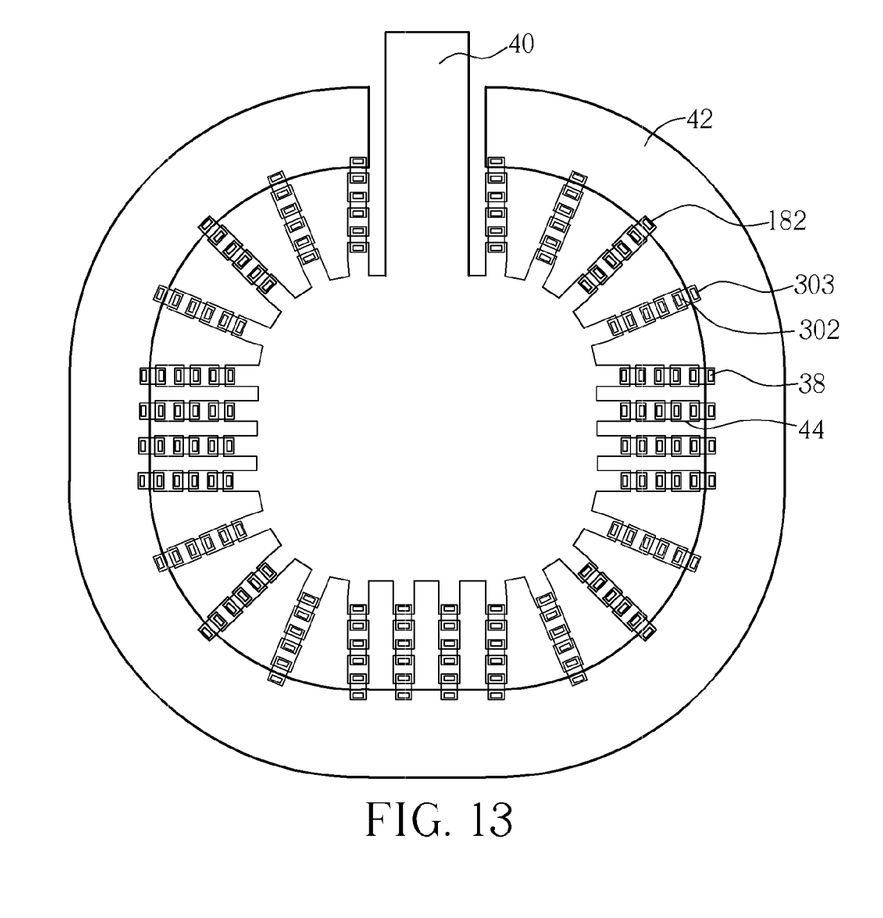
FIG. 13 is a top-view illustrating a trench ESD protection device according to another preferred embodiment of the present invention.

Please refer to FIG. 13, which is a top-view illustrating a trench ESD protection device according to another preferred embodiment of the present invention. As shown in FIG. 13, the second trench 182 of the present embodiment is smaller than the second trench 182 of the abovementioned embodiment. The present embodiment uses second trenches 182 of small size to form a pattern of concentric circles similar to the abovementioned embodiment. The third doped regions 303 of the second trenches 182 are electrically connected to the second doped regions 302 of the second trenches 182 arranged in the adjacent circles rather than to the third doped regions 303 of the second trenches 182 arranged in the same circle. In other words, there are a plurality of parallel-connected channels between the gate linking line 40 and the source 42. Each of the channels is constructed by respective serial-connected trench ESD protection devices.

The first dopant type and the second dopant type in the description of the present invention refer to two distinct dopant types, i.e. P type and N type. The dopant type of the devices may be selected depending on the trench MOS transistor device. For example, the first dopant type is P type and the second dopant type is N type in order to form a trench MOS transistor device, which is an NMOS transistor device. The first dopant type is N type and the second dopant type is P type in order to form a trench MOS transistor device, which is an PMOS transistor device. In addition, the trench MOS transistor devices of the present invention may include power trench MOS transistor devices, but are not limited. The trench ESD protection devices are used for providing ESD protection and the strength of the ESD protection may be increased by means of connecting the trench ESD protection devices in series.

Figure 14:
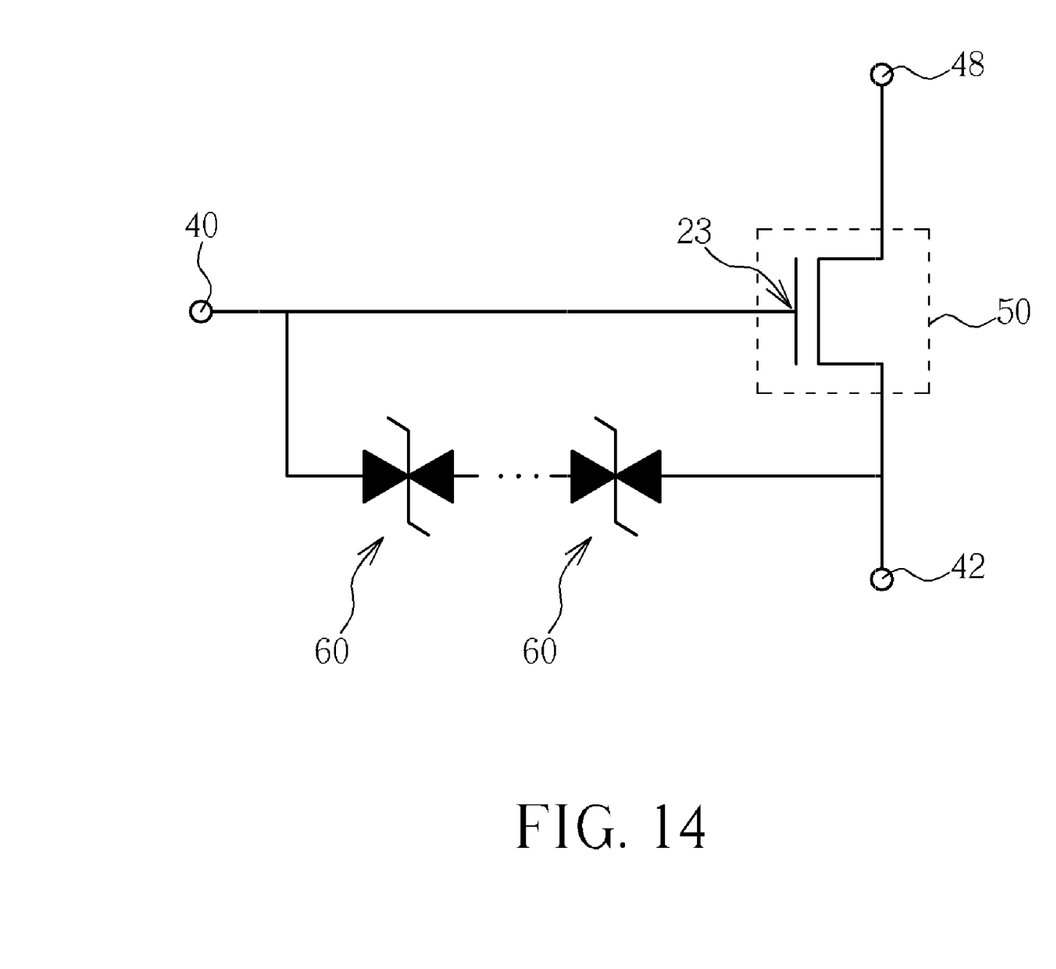
FIG. 14 is a schematic diagram illustrating the electrical circuit of the semiconductor device of the present invention.

Please refer to FIG. 14 together with FIG. 10. FIG. 14 is a schematic diagram illustrating the electrical circuit of the semiconductor device of the present invention. As shown in FIG. 10 and FIG. 14, the trench ESD protection devices 60 are connected in series. The trench ESD protection devices 60 are electrically connected to gate electrode 23 and the source electrode 42 of the trench MOS transistor device 50. If an ESD pulse resulting from friction or other uncertain factors occurs, the high-voltage ESD pulse impacts the trench ESD protection devices 60 and then exits from the source electrode 42. Therefore, the ESD pulse never goes to the gate electrode 23 of the trench MOS transistor device 50. Consequently, the trench MOS transistor device 50 is protected. Moreover, the trench ESD protection devices 60 are bi-directional and capable of providing ESD protection whether the ESD pulse is of positive voltage or of negative voltage.

As described above, the trench semiconductor device of the present invention has a trench MOS transistor device and a trench ESD protection device. The trench ESD protection device is electrically connected to the gate electrode and the source electrode of the trench MOS transistor device so as to provide a powerful ESD protection. Since the formation of the trench ESD protection device is incorporated with the manufacturing process of the trench MOS transistor device, no extra mask is required to define position of the doped regions of the trench ESD protection device. As a result, the method of the present invention has advantages of simplifying process and reducing production costs. In addition, the number of the trench ESD protection device may be adjusted depending on the expected strength of the ESD protection. The trench semiconductor of the present invention is applicable to all kinds of semiconductor devices.

Those skilled in the art will readily observe that numerous modifications and alterations of the device and method may be made while retaining the teachings of the invention.

What is claimed is:

1. A trench semiconductor device, comprising:
   a semiconductor substrate including a top surface and a bottom surface, the semiconductor substrate comprising a first device area and a second device area defined thereon, at least a first trench penetrating the top surface, formed in the semiconductor substrate, and formed in the first device area, and at least a second trench penetrating the top surface, formed in the semiconductor substrate, and formed in the second device area;
   at least a trench MOS transistor device disposed in the first device area, the trench MOS transistor device comprising:
      a dielectric layer disposed on a sidewall of the first trench;
      a gate electrode disposed in the first trench;
      a doped body disposed in semiconductor substrate on a side of the first trench;
      a source electrode disposed on the top surface of the semiconductor substrate and electrically connected to the doped body; and
      a drain electrode disposed on the bottom surface of the semiconductor substrate;
   a trench ESD protection device disposed in the second trench in the second device area, the trench ESD protection device comprising a first doped region and a second doped region, wherein the first doped region has a first dopant type, and the second doped region has a second dopant type distinct from the first dopant type; and
   a gate linking line disposed on the top surface of the semiconductor substrate, the gate linking line being electrically connected to the gate electrode of the trench MOS transistor device and the second doped region of the trench ESD protection device.

2. The trench semiconductor device of claim 1, wherein the gate electrode of the trench MOS transistor device comprises a doped semiconductor layer.

3. The trench semiconductor device of claim 2, wherein the doped semiconductor layer comprises a doped polysilicon layer.

4. The trench semiconductor device of claim 2, wherein the doped semiconductor layer has the second dopant type.

5. The trench semiconductor device of claim 1, wherein the doped body of the trench MOS transistor device has the first dopant type.

6. The trench semiconductor device of claim 1, wherein the trench ESD protection device further comprises a third doped region of the second dopant type disposed in the second trench, and the third doped region are electrically connected to the source electrode of the trench MOS transistor device.

7. The trench semiconductor device of claim 1, further comprising another trench ESD protection device disposed in another second trench and a connection electrode disposed on the top surface of the semiconductor substrate, wherein the trench ESD protection devices are electrically connected in series through the connection electrode.

8. The trench semiconductor device of claim 1, wherein the semiconductor substrate comprises a silicon substrate and an epitaxial silicon layer disposed on the silicon substrate, and the first trench and the second trench are disposed in the epitaxial silicon layer.

9. The trench semiconductor device of claim 1, wherein the trench MOS transistor device comprises a power trench MOS transistor device.

10. The trench semiconductor device of claim 1, wherein the trench ESD protection device comprises a diode.

11. A method of making a trench semiconductor device, comprising:
   providing a semiconductor substrate, the semiconductor substrate having a first device area and a second device area defined thereon, at least a first trench penetrating a top surface, formed in the semiconductor substrate, and formed in the first device area, and at least a second trench penetrating the top surface, formed in the semiconductor substrate, and formed in the second device area;
   forming a trench MOS transistor device in the first trench in the first device area and a trench ESD protection device in the second trench in the second device area, wherein the trench MOS transistor device comprises a gate electrode disposed in the first trench and a doped body disposed in the semiconductor substrate on a side of the first trench, and the trench ESD protection device comprises a first doped region and a second doped region, the first doped region and the second doped region having distinct dopant types; and
   forming a gate linking line and a source electrode on the top surface of the semiconductor substrate, wherein the gate linking line is electrically connected to the second doped region of the trench ESD protection device and the gate electrode of the trench MOS transistor device, and the source electrode is electrically connected to the doped body.

12. The method of making the trench semiconductor device of claim 11, further comprising steps of forming another trench ESD protection device in another second trench in the second device area, and forming a connection electrode on the top surface of the semiconductor substrate to electrically connect the trench ESD protection devices in series.

13. The method of making the trench semiconductor device of claim 11, further comprising a step of forming a drain electrode on a bottom surface of the semiconductor substrate.

* * * * *